United States Patent
Ishikawa et al.

(10) Patent No.: US 6,679,756 B2
(45) Date of Patent: Jan. 20, 2004

(54) METHOD AND APPARATUS FOR MONITORING POLISHING STATE, POLISHING DEVICE, PROCESS WAFER, SEMICONDUCTOR DEVICE, AND METHOD OF MANUFACTURING SEMICONDUCTOR DEVICE

(75) Inventors: Akira Ishikawa, Kawasaki (JP); Yoshijiro Ushio, Yokohama (JP)

(73) Assignee: Nikon Corporation, Tokyo (JP)

( * ) Notice: Subject to any disclaimer, the term of this patent is extended or adjusted under 35 U.S.C. 154(b) by 173 days.

(21) Appl. No.: 09/914,361
(22) PCT Filed: Dec. 19, 2000
(86) PCT No.: PCT/JP00/08993
§ 371 (c)(1), (2), (4) Date: Aug. 27, 2001
(87) PCT Pub. No.: WO01/48801
PCT Pub. Date: Jul. 5, 2001

(65) Prior Publication Data
US 2002/0127951 A1 Sep. 12, 2002

(30) Foreign Application Priority Data
Dec. 27, 1999 (JP) .......................... 11-371820

(51) Int. Cl.$^7$ .............................. B24B 49/00
(52) U.S. Cl. ................ 451/6; 451/41; 451/67
(58) Field of Search ................ 451/5, 6, 41, 285–290, 451/67, 8, 283, 490, 526; 356/381, 72, 382, 360; 250/559.27, 559.29; 438/14, 16; 156/626, 636; 216/60

(56) References Cited

U.S. PATENT DOCUMENTS

| | | | |
|---|---|---|---|
| 5,081,796 A | | 1/1992 | Schultz .................. 51/165.74 |
| 5,433,651 A | * | 7/1995 | Lustig et al. .................. 451/6 |
| 5,609,511 A | * | 3/1997 | Moriyama et al. ............. 451/5 |
| 5,838,447 A | * | 11/1998 | Hiyama et al. ............. 356/600 |
| 5,893,796 A | * | 4/1999 | Birang et al. ................ 451/526 |
| 6,142,855 A | * | 11/2000 | Nyui et al. .................... 451/67 |
| 6,190,234 B1 | * | 2/2001 | Swedek et al. ................ 451/6 |
| 6,489,624 B1 | * | 12/2002 | Ushio et al. ........... 250/559.27 |

FOREIGN PATENT DOCUMENTS

| | | |
|---|---|---|
| JP | 64-43707 | 2/1989 |
| JP | 11-33901 | 2/1999 |
| JP | 2000-326221 | 11/2000 |

\* cited by examiner

*Primary Examiner*—Joseph J. Hail, III
*Assistant Examiner*—Anthony Ojini
(74) *Attorney, Agent, or Firm*—Morgan, Lewis & Bockius LLP

(57) ABSTRACT

Prior to the polishing of the wafer, a reflective body which has the same shape and dimensions as the wafer is held on the polishing head instead of the wafer. A polishing agent is interposed between the window of the polishing head and the reflective body, and the reflective body is pressed against the polishing pad with the same pressure as that applied during the polishing of the wafer. In this state, the reflective body is irradiated via the window with a probe light emitted from the light source, and the spectroscopic intensity of the reflected light is obtained from the sensor as a reference spectrum. During the polishing of the wafer, the spectroscopic intensity of the reflected light from the wafer is successively obtained as measured spectra from sensor; the intensity ratio of these measured spectra to the above-mentioned reference spectrum is determined, and the polishing state of the wafer is monitored on the basis of this intensity ratio.

15 Claims, 12 Drawing Sheets

FIG. 11A1
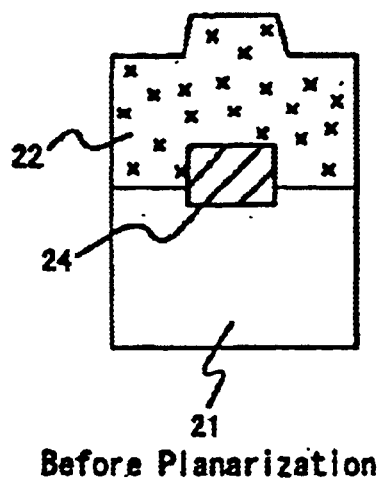
Before Planarization
FIG. 11A2
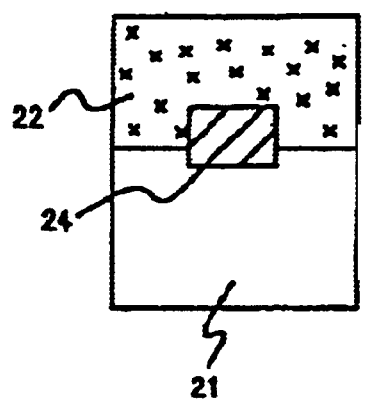
After Planarization

FIG. 11B1
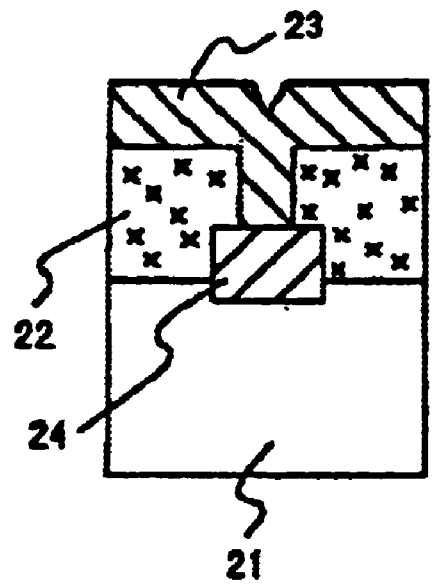
Before Planarization
FIG. 11B2
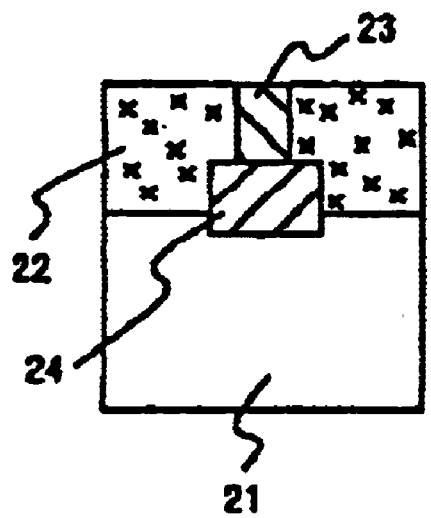
After Planarization

US 6,679,756 B2

METHOD AND APPARATUS FOR MONITORING POLISHING STATE, POLISHING DEVICE, PROCESS WAFER, SEMICONDUCTOR DEVICE, AND METHOD OF MANUFACTURING SEMICONDUCTOR DEVICE

This application is filed under 35 U.S.C. §371 from International Application PCT/JP00/08993, with an international filing date of Dec. 19, 2000, which claims the benefit of priority to Japanese Application No. 11-371820, filed Dec. 27, 1999, which are incorporated by reference in their entirety.

BACKGROUND OF THE INVENTION

1. Field of the Invention

The present invention relates to a polishing state monitoring method, polishing state monitoring device and polishing apparatus suitable for use in the planarization of semiconductor devices in a process in which semiconductor devices (such as ULSI devices, etc.) are manufactured, as well as a process wafer used in this polishing apparatus, a semiconductor device manufacturing method using this polishing apparatus, and a semiconductor device manufactured by this method.

2. Discussion of the Related Art

As semiconductor integrated circuits have become more highly integrated and smaller in size, processes required for the manufacture of such semiconductor integrated circuits have become more numerous and complicated. As a result, the surfaces of semiconductor devices are no longer always flat. The presence of step differences on the surfaces of semiconductor devices leads to wiring interruptions and local increases in resistance, etc., and thus causes circuit breaks and a drop in electrical capacitance. Furthermore, this also leads to deterioration of the withstand voltage and the occurrence of leakage in insulating films.

Meanwhile, as semiconductor integrated circuits have become more highly integrated and smaller in size, the light source wavelengths of semiconductor exposure apparatuses used in photolithography have become shorter, and the numerical apertures, or so-called NA, of the projection lenses of such semiconductor exposure apparatuses have become larger. As a result, the focal depths of the projection lenses of semiconductor exposure apparatuses have become substantially shallower. In order to handle such increased shallowness of the focal depth, it is necessary to flatten the surfaces of semiconductor devices to a greater degree than has previously been accomplished.

To describe this in concrete terms, a flattening technique such as that shown in FIGS. 11A1, 11A2, 11B1, and 11B2 has become essential in semiconductor processes. Here, a semiconductor device 24, an inter-layer insulating film 22 consisting of $SiO_2$ and a metal film 23 consisting of Al are formed on the surface of a silicon wafer 21. FIGS. 11A1 and 11A2 show examples in which the inter-layer insulating film 22 on the surface of the semiconductor device is flattened. FIGS. 11B1 and 11B2 show examples in which the metal film 23 on the surface of the semiconductor device is polished, so that a so-called "damascene" is formed. Chemical mechanical polishing or chemical mechanical-planarization (hereafter referred to as "CMP") has attracted attention as a method for the flattening of such semiconductor device surfaces.

CMP is a process in which irregularities in the surface of the wafer are removed by combining a chemical action (elution by means of a polishing agent or solution) with physical polishing; this process is an influential candidate for a global flattening technique. In concrete terms, a polishing agent called a "slurry" is used in which polishing particles (generally silica, alumina or cerium oxide, etc.) are dispersed in a medium such as an acid or alkali, etc., in which the object of polishing is soluble; polishing is caused to proceed by applying pressure to the wafer surface with a suitable polishing cloth, and grinding the surface by means of relative motion. Uniform polishing within the plane [of the surface] can be accomplished by making the application of pressure and speed of relative motion uniform over the entire surface of the wafer.

This process still suffers from many problems in terms of matching with conventional semiconductor processes, etc.; generally, a major problem that remains to be solved is monitoring of the polishing state (detection of the amount of polishing or polishing endpoint, etc.) while the polishing process is being performed (i.e., in-situ monitoring of the polishing state). There is a great demand for this in terms of improving the process efficiency as well.

In CMP, variations in the polishing rate occur as a result of local differences in the temperature distribution on the surface of the polishing pad and differences in the conditions of slurry supply, as well as differences in the pressure distribution. Furthermore, there are also differences in the polishing rate caused by variations in the surface conditions of the pad due to dressing, a drop in the polishing rate according to the number of wafers treated (deterioration caused by use) and individual differences in the pads used, etc. As a result of such problems, it is difficult to determine the endpoint of a specified amount of polishing by polishing time control.

Accordingly, methods have been proposed in which the endpoint is determined while measuring the motor torque or vibration, etc., in situ instead of determining the endpoint by time control. Such methods are somewhat effective in the case of CMP in which the material that is the object of polishing varies (e.g., CMP of wiring materials or CMP in which stopper layers are present). However, in the case of silicon wafers with complicated patterns, there is little variation in the material that is the object of polishing; accordingly, there may be instances in which determination of the endpoint is difficult. Furthermore, in the case of CMP of inter-layer insulating films, it is necessary to control the inter-wiring capacitance; accordingly, control of the residual film thickness is required rather than control of the polishing endpoint. It is difficult to measure the film thickness using methods that determine the endpoint by in-situ measurement of motor torque or vibration, etc.

Recently, therefore, monitoring of the polishing state (in-situ endpoint determination and in-situ film thickness measurement, etc.) by optical measurements, and specifically by the measurement of spectroscopic reflection, as described (for example) in Japanese Patent Application Kokai No. H11-33901, has been considered effective. In the case of such monitoring of the polishing state by the measurement of spectroscopic reflection, the wafer that is the object of polishing is irradiated with a probe light during CMP, and the amount of polishing or polishing endpoint is detected during polishing according to variations in the spectroscopic reflectivity of the light reflected from the wafer.

Light reflected from the polished surface of a wafer on which a semiconductor element is formed may be viewed as a superimposition of light waves from various layers and various parts of the device (laminated thin films); the waveform of the spectroscopic reflectivity varies according to the thickness of the layer that is being polished (i.e., the uppermost layer). This variation is stable (reproducible), and tends not to be affected by the interposed slurry, non-uniformity of the film thickness, or recesses and indentations in the surface or interfaces, etc. Accordingly, if the polishing state ascertained by measurement of the above-mentioned spectroscopic reflection is monitored, the wafer thickness, amount of polishing or polishing endpoint can be detected accurately in spite of the above-mentioned noise factors. Furthermore, the amount of polishing can be indirectly measured from the initial thickness of the wafer and the measured thickness of the wafer.

In the above-mentioned conventional monitoring of the polishing state by measurement of spectroscopic reflection, the measured spectrum which is the spectrum (intensity at various wavelengths) of the light reflected by the wafer indicates the spectroscopic reflectivity; accordingly, it would appear that the film thickness, etc., could be immediately determined from the measured spectrum.

In this case, however, the following problems arise:

Specifically, the measured spectrum is influenced not only by the thickness of the layer of the wafer that is being polished (i.e., the uppermost layer), but also by the spectroscopic characteristics of the light source emitting the probe light that irradiates the wafer. As a result, the waveform of the measured spectrum is disturbed according to the spectroscopic characteristics of the light source, so that the film thickness, etc., cannot always be determined with sufficient precision, thus making precise monitoring of the polishing state impossible. In addition, since the spectroscopic characteristics of the light source vary with elapsed time, the precision of monitoring of the polishing state drops as time passes.

Furthermore, since the measured spectrum is also influenced by the spectroscopic sensitivity characteristics of the light-receiving sensor that receives the reflected light, the waveform of the measured spectrum is also disturbed by these spectroscopic sensitivity characteristics, so that the precision of monitoring of the polishing state also drops in this regard as well. Moreover, since the spectroscopic sensitivity characteristics of the light-receiving sensor also vary with elapsed time, the precision of monitoring of the polishing state drops in this regard as well.

Furthermore, even though the precision tends not to be affected by the interposed slurry, it is desirable to reduce the effect of the interposed slurry even further in order to increase the precision of monitoring of the polishing state.

SUMMARY OF THE INVENTION

The present invention was devised in light of the above facts; one object of the present invention is to provide a polishing state monitoring method and polishing state monitoring device which make it possible to increase the precision of monitoring of the polishing state, and a polishing apparatus which uses this polishing state monitoring method and polishing state monitoring device.

Furthermore, another object of the present invention is to provide a process wafer which is suitable for realizing such a polishing state monitoring method.

In addition, another object of the present invention is to provide [a] a semiconductor device manufacturing method in which the process is made more efficient by monitoring the polishing state with good precision, so that semiconductor devices can be manufactured at a lower cost than in the case of conventional semiconductor device manufacturing methods, and [b] a low-cost semiconductor device.

The content of the present invention will be described below.

The invention is a polishing state monitoring method [a] in which the polishing state of an object of polishing which is polished by applying a load between a polishing body and this object of polishing in a state in which a polishing agent is interposed between this polishing body and object of polishing, and causing the polishing body and object of polishing to move relative to each other, is monitored during polishing, and [b] in which [i] the above-mentioned object of polishing is irradiated with a probe light emitted from a specified light source, [ii] a measured spectrum which is the spectrum of the light reflected by above-mentioned object of polishing is acquired during polishing, and [iii] the above-mentioned polishing state is monitored during polishing on the basis of the above-mentioned measured spectrum.

Furthermore, in this monitoring, a specified reflective body is irradiated with light emitted from the above-mentioned light source (for example, this light may be the same as the above-mentioned probe light, or may be light that is emitted from the above-mentioned light source and separately split from the probe light) either prior to the polishing of the above-mentioned object of polishing or during the polishing of the above-mentioned object of polishing, and a reference spectrum which is the spectrum of the light reflected by this reflective body is acquired; then, the above-mentioned polishing state is monitored during the polishing of the above-mentioned object of polishing on the basis of the relationship of the above-mentioned measured spectrum to the above-mentioned reference spectrum. Furthermore, light with numerous wavelength components such as white light, etc., is used as the above-mentioned probe light and the light that irradiates the above-mentioned reflective body.

It is desirable that the above-mentioned reflective body have flat spectroscopic characteristics; however, this reflective body may also have specified spectroscopic characteristics. In order to improve the S/N ratio of the measured spectrum that is acquired, it is desirable that the reflectivity of the above-mentioned reflective body be 20% or greater; a reflectivity of 30% or greater is even more desirable, a reflectivity of 50% or greater is more desirable yet, a reflectivity of 70% or greater is still more desirable, and a reflectivity of 90% or greater is even more desirable.

The above-mentioned relationship is a relationship in which the measured spectrum is replaced by a relative spectrum with the above-mentioned reference spectrum as a reference. The intensity ratio of the measured spectrum to the reference spectrum (i.e., the ratio of the intensity of the measured spectrum to the intensity of the reference spectrum at various wavelengths) may be cited as an example of the above-mentioned relationship; however, the present invention is not limited to such a relationship.

In the present invention, the above-mentioned measured spectrum is acquired during polishing, and the polishing state is monitored during polishing (in situ) on the basis of this measured spectrum; basically, therefore, monitoring of the polishing state based on the measurement of spectroscopic reflection is realized.

Furthermore, in the present invention, the measured spectrum is not used "as is;" instead, a specified reflective body is irradiated with light emitted from the probe-light light source either before polishing or during polishing, and the spectrum of the light reflected by this reflective body (reference spectrum) is acquired; then, the polishing state is monitored during polishing on the basis of the relationship of the measured spectrum to the reference spectrum.

Accordingly, even though the waveform of the measured spectrum itself is disturbed and caused to vary by the spectroscopic characteristics of the light source and changes over time, the reference spectrum and the measured spectrum are influenced in the same way by the spectroscopic characteristics of the light source; consequently, the effect of the spectroscopic characteristics of the light source can be more or less excluded from the above-mentioned relationship. Furthermore, if the respective beams of reflected light that are received when the measured spectrum and reference spectrum are acquired are received by the same light-receiving sensor, then the reference spectrum and measured spectrum are influenced in the same way by the spectroscopic sensitivity characteristics of the light-receiving sensor; accordingly, the effect of the spectroscopic sensitivity characteristics of the light-receiving sensor can be more or less excluded from the above-mentioned relationship. In the present invention, therefore, since the polishing state is monitored on the basis of the above-mentioned relationship, the precision of monitoring of the polishing state is increased.

Furthermore, in cases where the reference spectrum is acquired prior to polishing, it is desirable that this reference spectrum be acquired immediately prior to the initiation of polishing or at a point in time that is close to the point in time at which polishing is initiated, in order to exclude the effects of changes over time as far as this is possible. Of course, since changes over time in the spectroscopic characteristics of the light source or the light-receiving sensor do not appear in a short time, it is sufficient if the time from the acquisition of the reference spectrum to the initiation of polishing is a time which is short enough so that there is no conspicuous appearance of the effects of such changes over time.

Furthermore, examples of the above-mentioned polishing state include detection (or determination) of the remaining film thickness, amount of polishing or polishing endpoint.

The invention is characterized by the fact that in the invention the above-mentioned probe light and the above-mentioned light that is directed onto the above-mentioned reflective body are directed onto the above-mentioned object of polishing or the above-mentioned reflective body via one or more windows formed in the above-mentioned polishing body, or else the above-mentioned probe light and the above-mentioned light that is directed onto the above-mentioned reflective body are directed onto portions of the above-mentioned object of polishing or the above-mentioned reflective body that are exposed from the above-mentioned polishing body.

In the invention, windows may be present in or absent from the polishing body.

The invention is characterized by the fact that in the invention the above-mentioned reference spectrum is acquired in a state in which the above-mentioned polishing agent is interposed in the light path of the above-mentioned light that is directed onto the above-mentioned reflective body and the light path of the light that is reflected from this reflective body.

In the invention, the reference spectrum may also be acquired with no polishing agent interposed. However, if the polishing agent is interposed as in this invention, then a reference spectrum which shows the effects of the polishing agent can be acquired in a state that is close to the state in which the measured spectrum is acquired; accordingly, the effect of the polishing agent on the above-mentioned relationship (e.g., the effects of scattering and absorption caused by the polishing agent) can be reduced, so that the precision of monitoring of the polishing state can be further increased.

The invention is characterized by the fact that in the invention the above-mentioned reference spectrum is acquired in a state in which the above-mentioned polishing agent is interposed in the light path of the above-mentioned light that is directed onto the above-mentioned reflective body and the light path of the light that is reflected from this reflective body, and in which a load that is substantially the same as the load applied during the polishing of the above-mentioned object of polishing is applied between the above-mentioned polishing body and the above-mentioned reflective body.

In the invention, a load need not be applied between the polishing body and the reflective body at the time that the reference spectrum is acquired. However, if the reference spectrum is acquired while applying a load between the polishing body and the reflective body that is substantially the same as the load applied during the polishing of the object of polishing, as in this invention, then the thickness of the layer of the interposed polishing agent will also be similar to the thickness of the layer of the polishing agent at the time that the measured spectrum is acquired. Accordingly, in the present invention, a reference spectrum is acquired which reflects the effects of the polishing agent in a state that is much closer to the state that obtains when the measured spectrum is acquired than is the case in the invention; accordingly, the effect of the polishing agent on the above-mentioned relationship can be further reduced, so that the precision of monitoring of the polishing state can be increased even further.

The invention is characterized by the fact that in the invention the above-mentioned reference spectrum is acquired while the above-mentioned polishing agent is interposed in the light path of the above-mentioned light that is directed onto the above-mentioned reflective body and the light path of the light that is reflected from this reflective body, and while the above-mentioned reflective body is polished under substantially the same conditions as the polishing conditions used for the polishing of the above-mentioned object of polishing.

In the invention, the reflective body need not be polished at the time that the reference spectrum is acquired. However, if the reference spectrum is acquired while the reflective body is polished under substantially the same conditions as the polishing conditions used for the polishing of the object of polishing, as in the present invention, then the effects of variations in the thickness of the layer of polishing agent according to the polishing conditions, and the effects of bubbles that are admixed during the relative motion of the object of polishing and the polishing body, etc., will also be reflected in the reference spectrum. Accordingly, the present invention allows the acquisition of a reference spectrum that reflects the effects of the polishing agent in a state that is much closer to the state that obtains when the measured spectrum is acquired. Consequently, the effects of the polishing agent on the above-mentioned relationship are further reduced, so that the precision of monitoring of the polishing state is increased even further.

The invention is characterized by the fact that in any of the inventions the above-mentioned reflective body or a member which has this reflective body has substantially the same shape and dimensions as the above-mentioned object of polishing.

In the inventions, there are no particular limitations on the shape and dimensions of the reflective body or member which has the reflective body. In the present invention, however, the reflective body or member which has the reflective body can be handled in the same manner as the object of polishing, which is desirable.

Furthermore, in the inventions, there are no particular limitations on the reflective body; for example, this reflective body may consist of a mirror which is formed by forming a metal film that has the above-mentioned reflectivity, or a mirror-finished plate (e.g., a metal plate or mirror-finished silicon wafer, etc.). Such members are also suitable as the reflective body used in the present invention.

The invention is characterized by the fact that in the invention the above-mentioned object of polishing is a process wafer, [b] the above-mentioned reflective body or the above-mentioned member is also held beforehand in the container that accommodates the above-mentioned process wafer during the waiting period, and [c] the above-mentioned reflective body or the above-mentioned member is set in a specified polishing position at the time of acquisition of the above-mentioned reference spectrum using a device which sets the above-mentioned process wafer in the above-mentioned specified polishing position from the above-mentioned container.

In the present invention, the reflective body or member which has the above-mentioned reflective body can be handled in the same manner as the process wafer; accordingly, acquisition of the reference spectrum is simplified, which is desirable.

The invention is characterized by the fact that in any of the inventions the above-mentioned reflective body is installed in the holding part that holds the above-mentioned object of polishing during polishing.

If the reflective body is installed in the holding part that holds the object of polishing as in the present invention, then there is no need for a stage in which the reflective body is set in the polishing position when the reference spectrum is acquired. Furthermore, it becomes possible to acquire the reference spectrum during polishing.

The invention is characterized by the fact that in any of the inventions the above-mentioned object of polishing is a process wafer, and the above-mentioned reflective body is formed in an area of this process wafer other than the device areas (i.e., in a so-called dummy area).

In this case, for example, the reflective body can be formed as a so-called dummy cell in which a film of a metal that has the above-mentioned reflectivity is formed. The area in which the reflective body is formed may be a large area corresponding to one chip, or may be a smaller area.

If the reflective body is formed on the process wafer itself (which constitutes the object of polishing) as in the present invention, there is no need for the separate preparation of a reflective body.

The invention is a process wafer in which [a] a reflective body is formed on the side of the polished surface in an area other than the device areas, and [b] the size of the area in which the above-mentioned reflective body is formed is larger than the light spot that is directed onto the above-mentioned reflective body in order to acquire the reference spectrum (which is the spectrum of the light reflected by the above-mentioned reflective body).

The invention is a polishing state monitoring device which monitors the polishing state of the above-mentioned object of polishing using the polishing state monitoring method of any of the inventions. The present invention makes it possible to achieve highly precise monitoring of the polishing state in the same manner as in the inventions.

The invention is a polishing apparatus which is equipped with a polishing body and a holding part that holds the object of polishing during polishing, and in which the above-mentioned object of polishing is polished by applying a load between the above-mentioned polishing body and the above-mentioned object of polishing and by causing the relative motion of this polishing body and object of polishing in a state in which a polishing agent is interposed between the above-mentioned polishing body and the above-mentioned object of polishing. This polishing apparatus is equipped with the polishing state monitoring device that constitutes the invention. Since the present invention is equipped with the polishing state monitoring device that constitutes the invention, the polishing state can be monitored with good precision; as a result, the polishing process can be made more efficient.

The invention is a polishing apparatus which is equipped with a polishing body and a holding part that holds the object of polishing during polishing, and in which the above-mentioned object of polishing is polished by applying a load between the above-mentioned polishing body and the above-mentioned object of polishing and by causing the relative motion of this polishing body and object of polishing in a state in which a polishing agent is interposed between the above-mentioned polishing body and the above-mentioned object of polishing. In this polishing apparatus, the reflective body is disposed on the above-mentioned holding part so that this reflective body faces the same side as the side on which the above-mentioned object of polishing is held.

In the present invention, since the reflective body is held in the holding part, a polishing state monitoring device can be provided which is suitable for realizing the polishing state monitoring method that constitutes the invention.

The invention is a semiconductor device manufacturing method which has a process in which the surface of a semiconductor wafer is flattened using the polishing apparatus constituting the invention.

In the present invention, the process is made more efficient by monitoring the polishing state with good precision; as a result, semiconductor devices can be manufactured at a lower cost than in conventional semiconductor device manufacturing methods.

The invention is a semiconductor device which is manufactured by the semiconductor device manufacturing method constituting the invention. This invention makes it possible to provide a low-cost semiconductor device.

In cases where a metal is used as the above-mentioned reflective body in the respective inventions described above, examples of appropriate metals include Al, W, Cu, Pt, Si, Ag, Cr, Ni and stainless steel, etc.

As was described above, the present invention can provide a polishing state monitoring method and device which make it possible to improve the precision of monitoring of the polishing state, as well as a polishing apparatus which uses this monitoring method and device.

Furthermore, the present invention can provide a process wafer which is suitable for realizing such a polishing state monitoring method.

Moreover, the present invention can provide [a] a semiconductor device manufacturing method in which the process efficiency is increased by monitoring the polishing state with good precision, so that semiconductor devices can be manufactured at a lower cost than in conventional semiconductor device manufacturing methods, and [b] a low-cost semiconductor device.

BRIEF DESCRIPTION OF THE DRAWINGS

FIG. 11 shows FIGS. 11A1, 11A2, 11B1, and 11B2 show conceptual diagrams which illustrate the flattening technique used in a semiconductor manufacturing process; these diagrams are sectional views of a semiconductor device.

DETAILED DESCRIPTION OF THE PREFERRED EMBODIMENTS

Below, preferred working configurations of the present invention will be described with reference to the attached figures in order to describe the present invention in greater detail. However, it goes without saying that the contents of these working configurations do not limit the scope of the present invention.

First Working Configuration

Figure 1:
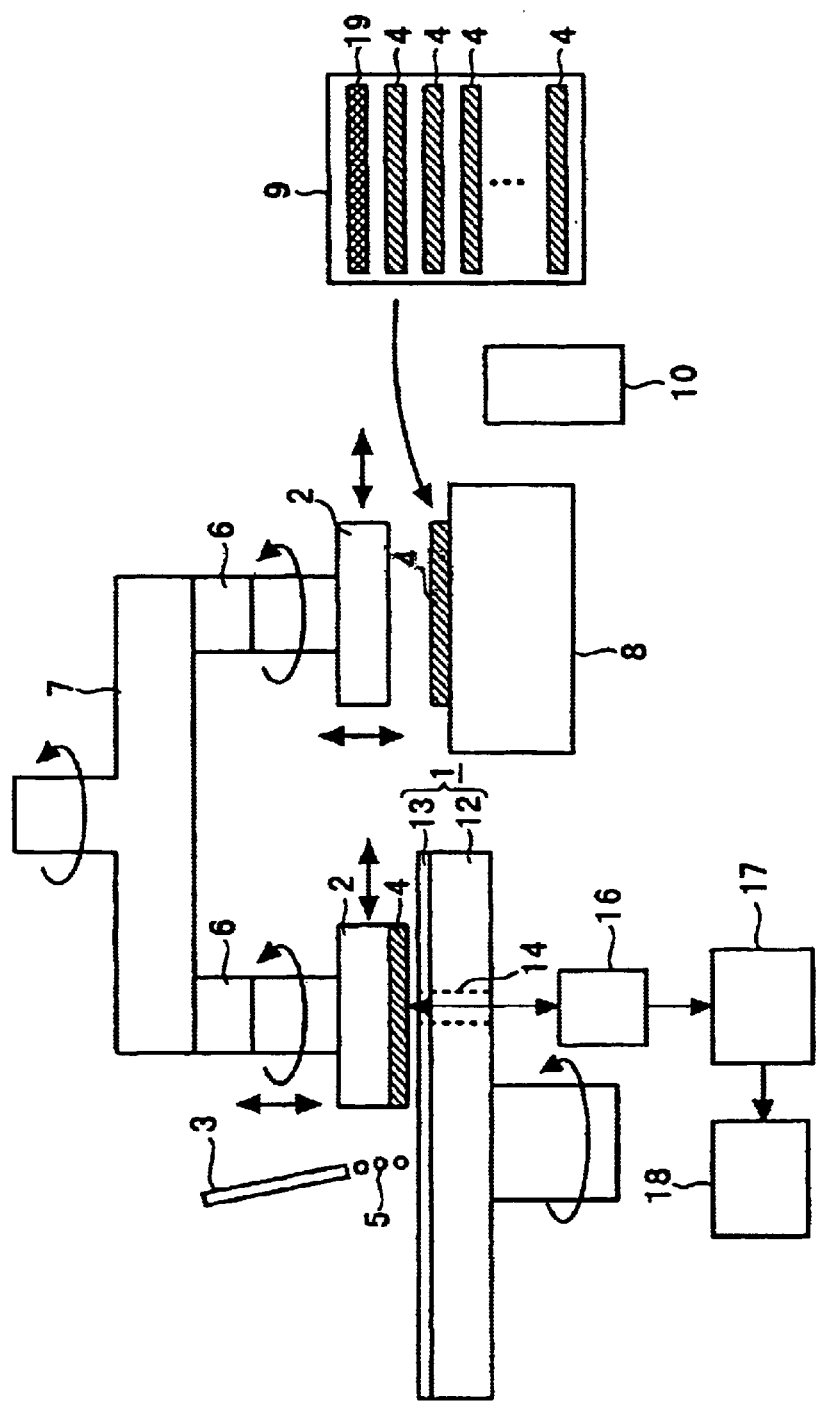
FIG. 1 is a schematic structural diagram which shows a polishing apparatus constituting one working configuration of the present invention in model form.
Figure 2:
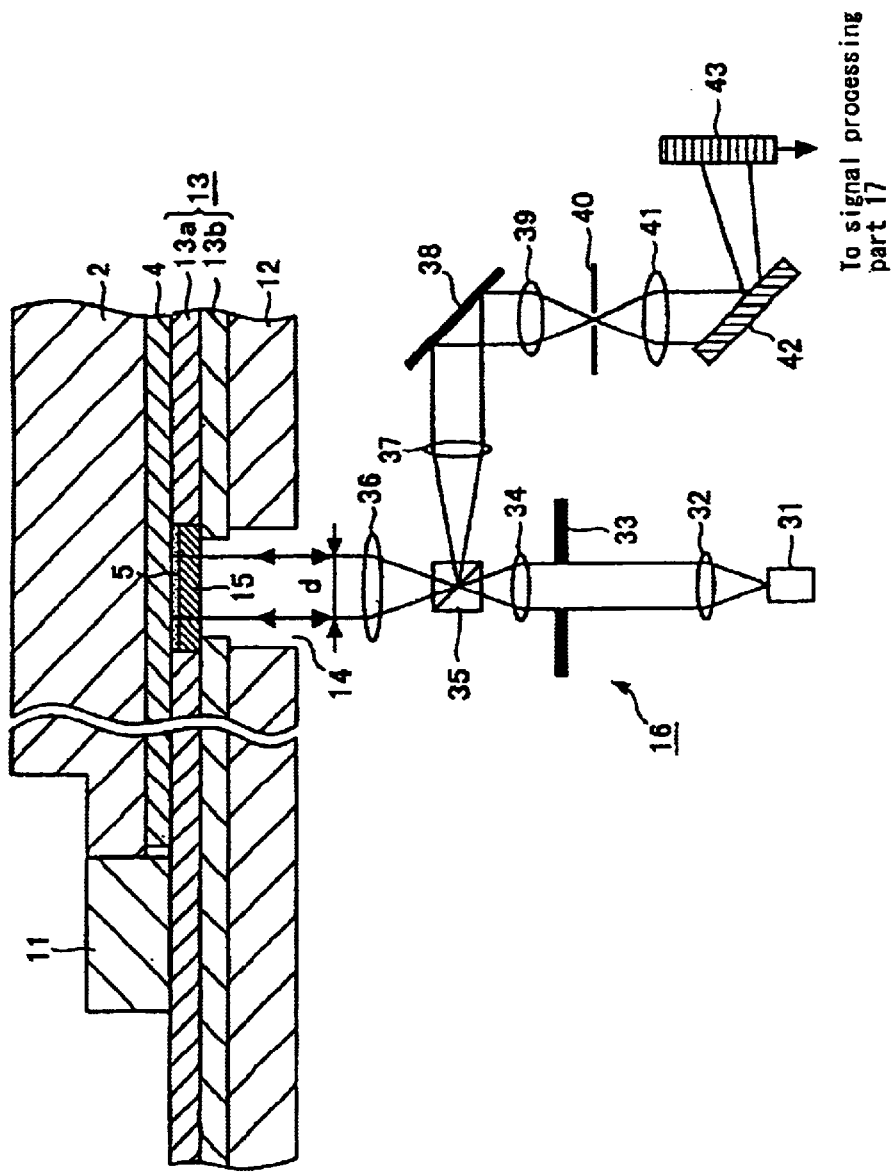
FIG. 2 shows a partial enlarged sectional view of the polishing apparatus shown in FIG. 1, and a diagram which shows the measurement optical system in model form.

FIG. 1 is a schematic structural diagram which illustrates a polishing apparatus (or planarization apparatus) constituting a first working configuration of the present invention in model form. FIG. 2 shows a partial enlarged sectional view of this polishing apparatus, and a diagram which illustrates the measurement optical system 16 in model form.

This polishing apparatus is equipped with a polishing member 1, a plurality of object-of-polishing holding parts 2 (hereafter referred to as "polishing heads"), and a polishing agent supply part 3 which supplies a polishing agent (slurry) 5.

In the state shown in FIG. 1 and FIG. 2, a silicon wafer 4 used as a process wafer that constitutes the object of polishing is held by vacuum chucking on the polishing head 2 shown on the left side of the figure, which is disposed in a position facing the polishing member 1. As will be described later, a reflective body 19 is held on the polishing head 2 instead of the wafer 4 prior to the polishing of the wafer 4. In the present working configuration, the reflective body 19 has substantially the same shape and dimensions as the wafer 4; for example, a mirror which is formed by forming a metal film, or a mirror-finished plate (e.g., a metal plate or mirror-finished silicon wafer, etc.), may be used. Alternatively, a member which has substantially the same shape and dimensions as the wafer 4, and which has a reflective body formed in an area constituting one portion of this member (i.e., an area that includes an area corresponding to the window 15, which will be described later), may be used instead of the reflective body 19. One example of such a member is a member in which a metal film is formed in a partial area on the surface of a glass plate.

The respective polishing heads 2 are supported by a supporting body 7 via respective mechanisms 6, and are arranged so that these polishing heads 2 can be caused to rotate, move vertically or swing to the left and right (in a reciprocating motion) relative to the supporting body 7 by the respective mechanisms 6 as indicated by the arrows in FIG. 1. Furthermore, the apparatus is arranged so that the respective polishing heads 2 can be positioned in a position facing the polishing member I (i.e., the polishing position), a position facing a stand-by stage 8 (i.e., a waiting position), or a position facing an unloading stage not shown in the figures (i.e., an extraction position), as a result of the rotation of the supporting body 7 as indicated by the arrow in FIG. 1.

Furthermore, a plurality of wafers 4 and a reflective body 19 are held inside a cassette 9 which is used as a container that accommodates the wafers 4 that are to be polished during the waiting period for polishing. The reflective body 19 and plurality of wafers 4 inside the cassette 9 are successively conveyed onto the stand-by stage 8 by a conveying robot 10 beginning with the reflective body 19, and the reflective body 19 or wafer 4 that has been conveyed onto the stand-by stage 8 is held by means of vacuum chucking, etc., by the polishing head 2 that is in the waiting position.

At the same time, acquisition of a reference spectrum or polishing is performed as described below with respect to the reflective body 19 or wafer 4 that is held on the polishing head 2 in the polishing position. Prior to this, the reflective body 19 or wafer 4 for which the reference spectrum acquisition processing or polishing process has been completed, is removed onto the unloading stage from the extraction position of the polishing head 2, and is conveyed into another cassette (not shown in the figures) by a conveying robot not shown in the figures.

When the treatments of the respective positions are completed, the supporting body 7 is rotated so that the respective polishing heads 2 are positioned in the positions of the next steps. As is shown in FIG. 2, the respective polishing heads 2 each have a retainer ring 11 (omitted from FIG. 1) which is used to prevent the wafer from flying off. This ring 11 is not absolutely necessary.

As is shown in FIGS. 1 and 2, the polishing member 1 is a member in which a polishing body (polishing pad) 13 is disposed on a platen 12 which has an opening part 14. The polishing body 13 is bonded to the platen 12 by means of a two-sided tape or adhesive agent. The polishing member 1 is arranged so that it can rotate in the direction indicated by the arrow in FIG. 1. The center of the opening part 14 is set so that it coincides with the center of rotation of the polishing head 2 in the polishing position when this polishing head 2 is positioned at the pivoting center.

As is shown in FIG. 2, the polishing body 13 is a two-layer pad formed by bonding together two sheet-form polishing pads 13a and 13b consisting of a foam polyurethane, etc. A slightly larger opening parts is formed in the upper polishing pad 13a, and a slightly smaller opening part is formed in the lower polishing pad 13b. The centers of these opening parts coincide with the center of rotation of the polishing head 2. A transparent acrylic window 15 is inserted and fastened in place in the opening part of the upper polishing pad 13a. The surface of the window 15 on the side of the object of polishing is slightly recessed with respect to the surface of the polishing pad 13a of the polishing body 13 that is contacted by the wafer 4. As a result, the wafer 4 and the window 15 do not contact each other, so that scratching of the surfaces of the wafer 4 and window 15 is eliminated. The polishing agent 5 supplied from the polishing agent supply part 3 enters this recess. FIG. 2 shows a state in which the polishing agent 5 has entered this recess.

Here, the polishing of the wafer 4 held by the polishing head 2 that is positioned in the polishing position will be described. This wafer 4 is caused to swing back and forth while being rotated by the above-mentioned polishing head 2, and is pressed against the polishing body 13 of the polishing member 1 with a specified pressure. The polishing member 1 is also caused to rotate, and is caused to perform a relative motion with respect to the wafer 4. In this state, the polishing agent 5 is supplied to the surface of the polishing body 13 from the polishing agent supply part 3; this polishing agent 5 diffuses over the surface of the polishing body 13, and enters the space between the polishing body 13 and the wafer 4 as the polishing member 1 and wafer 4 move relative to each other, so that the polished surface of the wafer 4 is polished. Specifically, favorable polishing is performed as a result of a synergistic effect of the mechanical polishing caused by the relative motion of the polishing member 1 and wafer 4, and the chemical action of the polishing agent 5.

Furthermore, as is shown in FIG. 1, this polishing apparatus is also equipped with a measurement optical system 16, a signal processing part 17 consisting of a personal computer, etc., and a display part 18 such as a CRT, etc., which displays the monitoring results; these parts constitute the polishing state monitoring device.

The measurement optical system 16 irradiates the polished surface of the wafer 4 or the reflective body 19 held on the polishing head 2 in the polishing position with probe light via the window 15; the light reflected by the polished surface of the wafer 4 or the reflective body 19 is split into a spectrum, and the intensity at each wavelength is detected by a light-receiving sensor. This detection signal is input into the signal processing part 17 as a measured spectrum or reference spectrum, and is processed in a manner that will be described later.

One concrete example of the measurement optical system 16 will be described with reference to FIG. 2. In FIG. 2, light from a xenon lamp 31 which constitutes the irradiating light source is converted into a parallel light beam by a lens 32; this light beam passes through a slit 33, and is focused on a beam splitter 35 by a lens 34. The light that has passed through the beam splitter 35 is again converted into a parallel light beam by a lens 36; this light passes through the window 15, and is directed onto the polished surface of the wafer 4 or onto the reflective body 19.

The reflected light again passes through the window 15 and the lens 36, and is focused on the beam splitter 35. In the beam splitter 35, the direction of the reflected light is altered by 90°, and the light is again converted into a parallel light beam by a lens 37. Then, the light is reflected by a reflective mirror 38, and is focused on a pinhole 40 by a lens 39. Next, noise components such as scattered light and diffracted light, etc., are removed, and the light is projected onto a diffraction grating 42 via a lens 41, so that the light is split into a spectrum. The light that has thus been split into a spectrum is incident on a linear sensor 43 used as a light-receiving sensor, and the spectroscopic intensities (intensities at respective wavelengths, i.e., intensities of the spectrum) are measured.

In the present working configuration, the size (i.e., the diameter in the present example) d of the spot of the probe light that is directed onto the wafer 4 or reflective body 19 is set so that this size is sufficiently larger than the smallest structure of the device on the wafer 4. Numerous periodic structures that are aggregates of small individual elements are present on the wafer 4 that is the object of polishing, so that the wafer 4 is not uniform when viewed in fine detail. Accordingly, if the spot diameter d of the irradiating probe light is small, the reflected light is affected by such fine structures, so that the reflected light varies according to the irradiation position, leading to the possibility that this will create noise. However, if the spot diameter d of the irradiating probe light is made sufficiently larger than the smallest structure of the device on the wafer, the reflected light will be constant regardless of the irradiation position of the probe light, so that a stable signal can be obtained.

Here, the reference spectrum acquisition processing that is performed prior to the polishing of the wafer 4 in the present working configuration will be described.

In a first example of this processing, the spectrum that is measured by the measurement optical system 16 in a state in which [a] the reflective body 19 is held on the polishing head 2 that is in the polishing position, [b] the polishing member 1 is not rotated, and the above-mentioned polishing head 2 is neither rotated nor caused to swing, [c] the pressing pressure (load) is more or less zero (with either a gap or no gap being left between the reflective body 19 and polishing body 13), and [d] no polishing agent 5 is interposed between the reflective body 19 and the window 15, is stored in the memory (not shown in the figures) of the signal processing part 17 as the reference spectrum.

In a second example of this processing, the spectrum that is measured by the measurement optical system 16 in a state in which [a] the reflective body 19 is held on the polishing head 2 that is in the polishing position, [b] the polishing member 1 is not rotated, and the above-mentioned polishing head 2 is neither rotated nor caused to swing, [c] the pressing pressure (load) is more or less zero (with either a gap or no gap being left between the reflective body 19 and polishing body 13), and [d] the above-mentioned polishing agent 5 is interposed between the reflective body 19 and the window 15, is stored in the memory (not shown in the figures) of the signal processing part 17 as the reference spectrum. Furthermore, the above-mentioned polishing agent 5 can be interposed between the reflective body 19 and the window 15 by rotating the polishing member 1 while supplying the polishing agent 5 from the polishing agent supply part 3 beforehand, etc.

In a third example of the above-mentioned processing, the spectrum that is measured by the measurement optical system 16 in a state in which [a] the reflective body 19 is held on the polishing head 2 that is in the polishing position, [b] the polishing member 1 is not rotated, and the above-mentioned polishing head 2 is neither rotated nor caused to swing, [c] the reflective body 19 is pressed against the polishing body 13 with a pressure that is more or less the same as the pressing pressure (load) that is applied during the polishing of the wafer 4, and [d] the above-mentioned polishing agent 5 is interposed between the reflective body 19 and the window 15, is stored in the memory (not shown in the figures) of the signal processing part 17 as the reference spectrum.

In a fourth example of the above-mentioned processing, the spectrum that is measured by the measurement optical system 16 in a state in which [a] the reflective body 19 is held on the polishing head 2 that is in the polishing position, [b] the above-mentioned polishing agent 5 is interposed between the reflective body 19 and the window 15, and [c] the reflective body 19 is polished under more or less the same conditions as the polishing conditions used during the polishing of the wafer 4, is stored in the memory (not shown in the figures) of the signal processing part 17 as the reference spectrum.

Furthermore, in the present working configuration, the spectra successively measured by the measurement optical system 16 during the polishing of the wafer 4 are stored in the memory (not shown in the figures) of the signal processing part 17 as the measured spectra obtained at these respective points in time Furthermore, each time that a measured spectrum is obtained at a given point in time during the polishing of the wafer 4, the signal processing part 17 calculates (for example) the intensity ratio of this measured spectrum to the above-mentioned reference spectrum (i.e., the ratio of the intensities of the measured spectrum at respective wavelengths to the intensities of the reference spectrum at these wavelengths), as the relationship of the measured spectrum to the reference spectrum. Then, the signal processing part 17 calculates the results of monitoring of the polishing state of the wafer 4 on the basis of the intensity ratios for the wavelengths thus calculated, and displays these results on the display part, or determines the polishing endpoint, and sends a command that ends the polishing operation to the control part of the above-mentioned polishing apparatus when the polishing endpoint is detected.

For example, the film thickness of the layer that is being polished (i.e., the uppermost layer) is calculated from the maximum and minimum positions (wavelengths) of the waveform of the intensity ratio of the measured spectrum to the reference spectrum, and this film thickness is displayed on the display part 18 as the monitoring results. The polishing endpoint is then detected according to whether or not this measured film thickness has reached a specified film thickness. Or, for example, the amount of polishing is determined from the initial thickness of the wafer and the film thickness of the layer that is being polished (i.e., the uppermost layer), and this amount of polishing is displayed on the display part 18 as the monitoring results.

Of course, in the present working configuration, the calculation method used to determine the monitoring results from the intensity ratios for the wavelengths of the measured spectrum using the reference spectrum as a reference, and the method used to detect the polishing endpoint, are not limited to the examples described above.

In the present working configuration, as is clear from the above description, the measured spectrum is not used "as is;" instead, the reflective body 19 is irradiated prior to polishing with the probe light that is used to acquire the measured spectrum, the spectrum of the light reflected by the reflective body 19 (i.e., a reference spectrum) is acquired, and the polishing state is monitored during polishing on the basis of the relationship of the measured spectrum to the reference spectrum.

Accordingly, although the waveform of the measured spectrum itself varies as a result of being disturbed by the spectroscopic characteristics of the light source 31 and changes in these characteristics over time, the spectroscopic characteristics of the light source 31 are similarly reflected in the reference spectrum and measured spectrum; accordingly, the effects of the spectroscopic characteristics of the light source 31 are more or less excluded from the intensity ratio of the measured spectrum to the reference spectrum.

Furthermore, since the respective reflected light beams are received by the same linear sensor 43 when the measured spectrum and reference spectrum are acquired, the spectroscopic sensitivity characteristics of the linear sensor 43 are similarly reflected in the reference spectrum and measured spectrum; accordingly, the effects of the spectroscopic sensitivity characteristics of the linear sensor 43 are more or less excluded from the intensity ratio of the measured spectrum to the reference spectrum. Consequently, since the polishing state is monitored on the basis of the above-mentioned intensity ratio in the present working configuration, the precision of monitoring of the polishing state is increased.

Furthermore, in the present working configuration, since the reflective body 19 has more or less the same shape and dimensions as the wafers 4, the reflective body 19 can be handled in the same manner as the wafers 4 using the cassette 9, stand-by stage 8 and conveying robot 10, as was described above. Accordingly, the acquisition of the reference spectrum is simplified.

Second Working Configuration

Figure 3:
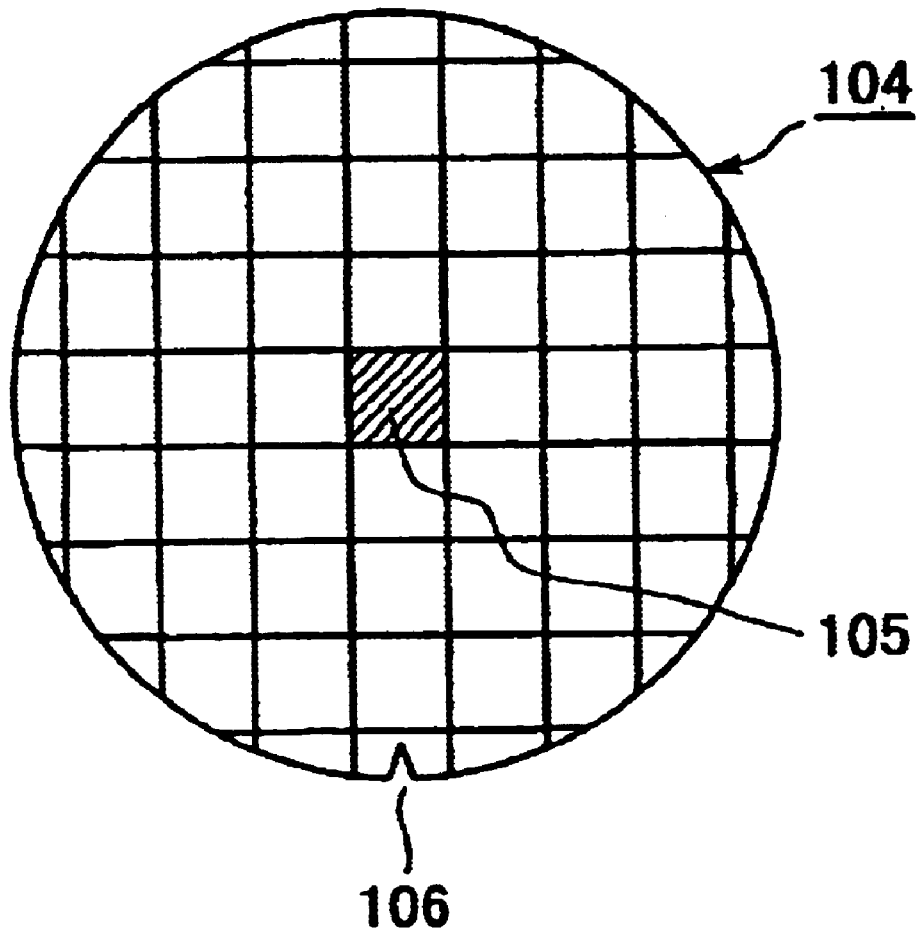
FIG. 3 is a plan view which shows a process wafer constituting another working configuration of the present invention in model form.

FIG. 3 is a plan view which shows in model form a process wafer 104 used in a second working configuration of the present invention.

The main points of difference between the present working configuration and the above-mnentioned first working configuration are as follows: specifically, in the present working configuration, a reflective body 19 is not used, and the process wafer 104 shown in FIG. 3 is used instead of an ordinary process wafer 4; furthermore, the reference spectrum acquisition processing differs accordingly. In all other respects, the present working configuration is similar to the above-mentioned first working configuration.

As is shown in FIG. 3, the process wafer 104 differs from the above-mentioned ordinary process wafer 4 in that a reflective body 105 used to acquire the reference spectrum is formed on this process wafer 104 in an area other than the device areas. In FIG. 3, the respective rectangular areas other than the areas where the reflective body 105 is formed indicate device areas having the size of one chip. In the present working configuration, the reflective body 105 is formed in an area having the size of one chip, and a metal film such as an Al film, etc., is formed as the reflective body 105 on the side of the polished surface of the above-mentioned process wafer 104 throughout this entire area having the size of one chip.

The size of the area in which the reflective body 105 is formed is far larger than the spot diameter d of the probe light in FIG. 2. Of course, the reflective body may also be formed in an area that is smaller than a device area having the size of one chip, as long as this area is larger than the spot diameter d of the probe light in FIG. 2. In FIG. 3, 106 indicates a notch. Furthermore, in the present working configuration, the reflective body 105 is formed in an area located at the center of the wafer 104; however, the position of the reflective body 105 may be appropriately determined with the positional relationship with the window 15, etc., being taken into account.

In the present working configuration, for example, the reference spectrum acquisition processing may be performed as indicated in the following examples:

In a first example of this processing, the spectrum measured by the measurement optical system 16 in a state in which [a] the wafer 104 is held on the polishing head 2 that is in the polishing position, [b] the polishing member 1 is not rotated, and the above-mentioned polishing head 2 is neither rotated nor caused to swing, [c] the pressing pressure (load) is more or less zero (with either a gap or no gap being left between the wafer 104 and polishing body 13), and [d] no polishing agent 5 is interposed between the reflective body 105 and the facing window 15, is stored in the memory (not shown in the figures) of the signal processing part 17 as the reference spectrum. This processing is performed prior to the polishing of the wafer 104.

In a second example of this processing, the spectrum measured by the measurement optical system 16 in a state in which [a] the wafer 104 is held on the polishing head 2 that is in the polishing position, [b] the polishing member 1 is not rotated, and the above-mentioned polishing head 2 is neither rotated nor caused to swing, [c] the pressing pressure (load) is more or less zero (with either a gap or no gap being left between the reflective body 105 and polishing body 13), and [d] the above-mentioned polishing agent 5 is interposed between the reflective body 105 and the window 15, is stored in the memory (not shown in the figures) of the signal processing part 17 as the reference spectrum. This processing is performed prior to the polishing of the wafer 104.

In a third example of this processing, the spectrum measured by the measurement optical system 16 in a state in which [a] the wafer 104 is held on the polishing head 2 that is in the polishing position, [b] the polishing member 1 is not rotated, and the above-mentioned polishing head 2 is neither rotated nor caused to swing, [c] the wafer 104 is pressed against the polishing body 13 with a pressure that is more or less the same as the pressing pressure (load) that is applied during the polishing of the wafer 104, and [d] the above-mentioned polishing agent 5 is interposed between the reflective body 105 and the window 15, is stored in the memory (not shown in the figures) of the signal processing part 17 as the reference spectrum. This processing is performed prior to the polishing of the wafer 104.

In a fourth example of this processing, the spectrum measured by the measurement optical system 16 in a state in which the reflective body 105 faces the window 15 during the polishing of the wafer 104 is stored in the memory (not shown in the figures) of the signal processing part 17 as the reference spectrum. Here, in cases where reference spectra are successively obtained during the polishing of the wafer 104 (in the present example, for instance, the reference spectrum may also be obtained only once), the most recent reference spectrum at the point in time in question (for example) may be used when the intensity ratio of the measured spectrum is determined with the reference spectrum as a reference.

In the present working configuration, advantages similar to those of the above-mentioned first working configuration are obtained; furthermore, an additional advantage is obtained in that there is no need to prepare a separate reflective body 19. Moreover, if the above-mentioned fourth example is used, a reference spectrum can be obtained which reflects the effects of the polishing agent in the state in which the measured spectrum is acquired; accordingly, the effects of the polishing agent on the intensity ratio of the measured spectrum to the reference spectrum can be further reduced, so that the precision of monitoring of the polishing state can be increased even further.

Third Working Configuration

Figure 4:
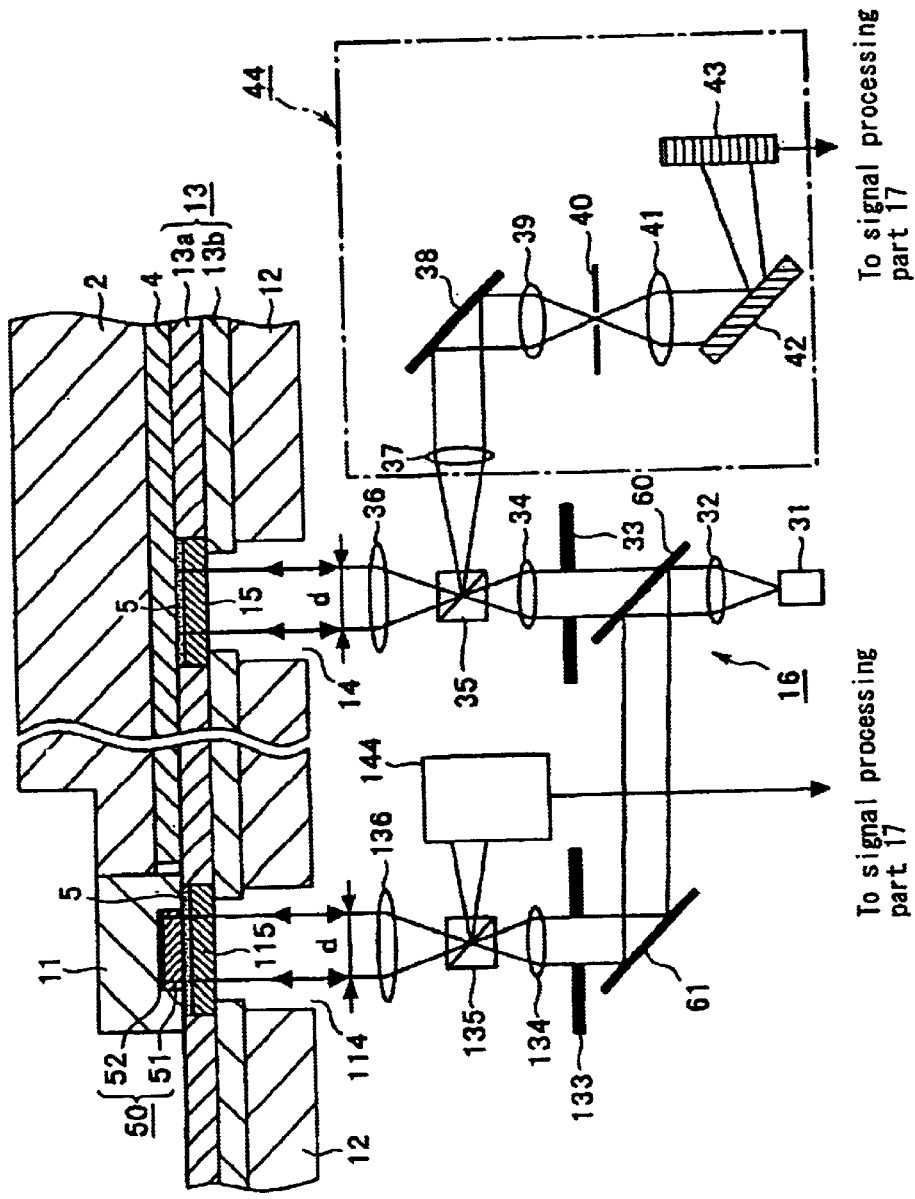
FIG. 4 is a diagram which shows the essential parts of a polishing apparatus constituting still another working configuration of the present invention.

FIG. 4 is a diagram which illustrates the essential parts of a polishing apparatus constituting a third working configuration of the present invention; this diagram corresponds to FIG. 2. In FIG. 4, elements which are the same as in FIG. 2 or which correspond to elements in FIG. 2 are labeled with the same symbols, and a redundant description of these elements is omitted. The present working configuration differs from the above-mentioned first working configuration only in the following respects:

In the present working configuration, a reflective body 19 is not used; instead, a reflective body 50 is disposed on the retainer ring 11 of the polishing head 2 on the same side as the side on which the wafer 4 is held (i.e., the lower side in FIG. 4). In the present working configuration, the reflective body 50 is constructed as a ring-form mirror which is formed by forming a metal film 52 on the upper surface of a ring-form member 51 consisting of a transparent acrylic resin.

This reflective body 50 is attached to the retainer ring 11 so that the surface of the transparent acrylic resin member 51 coincides with the surface of the retainer ring 11. Accordingly, during the polishing of the wafer 4, the reflective body 50 is also polished. The center of the reflective body 50 coincides with the center of rotation of the polishing head 2. A somewhat larger opening part is formed in the upper polishing pad 13a, while a somewhat smaller opening part is formed in the lower polishing pad 13b. The centers of these opening parts coincide with the center of the width of the reflective body 50 in the direction of the diameter of the reflective body 50.

A transparent acrylic window 115 is inserted and fastened in place in the opening part of the upper polishing pad 13a. As in the case of the window 15, the surface of the window 115 on the side of the object of polishing is slightly recessed with respect to the surface of the polishing pad 13a of the polishing body 13 that is contacted by the wafer 4. The polishing agent 5 supplied from the polishing agent supply part 3 also enters this recess; FIG. 4 shows a state in which the polishing agent 5 has entered this recess. An opening part 114 is formed in the platen 12 in a position that faces the reflective body 50 when the polishing head 2 in the polishing position is positioned at the pivoting center.

In the present working configuration, furthermore, as is shown in FIG. 4, a half-mirror 60 which is disposed between the lens 32 and slit 33, a mirror 61, a slit 133, lens 134, beam splitter 135 and lens 136 which correspond to elements 33 through 36 shown in the figures, and an optical system 144 which corresponds to the optical system 44 shown in the figures, are added to the measurement optical system 16 shown in FIG. 2. As a result, the acquisition of the reference spectrum and the acquisition of the measured spectrum can be accomplished simultaneously.

Specifically, one of the light beams (probe light) obtained as a result of the light emitted from the xenon lamp 31 and caused to pass through lens 32 being split by the half-mirror 60 passes through the window 15 and is directed onto the wafer 4, and the spectroscopic intensity (measured spectrum) of the resulting reflected light is obtained from the linear sensor 43. At the same time, the other light beam obtained as a result of the light emitted from the same xenon lamp 31 and caused to pass through lens 32 being split by the half-mirror 60 passes through the window 115 and is directed onto the reflective body 50; this light is processed by the optical system 144 corresponding to the optical system 44, and the spectroscopic intensity (reference spectrum) of the resulting reflected light is obtained from a linear sensor (corresponding to the linear sensor 43 in the optical system 44) installed in the optical system 144.

In the present working configuration, for example, the reference spectrum acquisition processing may be performed as indicated in the following examples:

In a first example of this processing, the reference spectrum obtained from the linear sensor of the optical system 144 of the measurement optical system 16 in a state in which [a] the wafer 4 is held on the polishing head 2 that is in the polishing position, [b] the polishing member 1 is not rotated, and the above-mentioned polishing head 2 is neither rotated nor caused to swing, [c] the pressing pressure (load) is more or less zero (with either a gap or no gap being left between the wafer 4 and polishing body 13), and [d] no polishing agent 5 is interposed between the reflective body 50 and the facing window 115, is stored in the memory (not shown in the figures) of the signal processing part 17. This processing is performed prior to the polishing of the wafer 4.

In a second example of this processing, the reference spectrum obtained from the linear sensor of the optical system 144 of the measurement optical system 16 in a state in which [a] the wafer 4 is held on the polishing head 2 that is in the polishing position, [b] the polishing member 1 is not rotated, and the above-mentioned polishing head 2 is neither rotated nor caused to swing, [c] the pressing pressure (load) is more or less zero (with either a gap or no gap being left between the reflective body 50 and polishing body 13), and [d] the above-mentioned polishing agent 5 is interposed between the reflective body 50 and the window 115, is stored in the memory (not shown in the figures) of the signal processing part 17. This processing is performed prior to the polishing of the wafer 4.

In a third example of this processing, the reference spectrum obtained from the linear sensor of the optical system 144 of the measurement optical system 16 in a state in which [a] the wafer 4 is held on the polishing head 2 that is in the polishing position, [b] the polishing member 1 is not rotated, and the above-mentioned polishing head 2 is neither rotated nor caused to swing, [c] the wafer 4 is pressed against the polishing body 13 with a pressure that is more or less the same as the pressing pressure (load) that is applied during the polishing of the wafer 4, and [d] the above-mentioned polishing agent 5 is interposed between the reflective body 50 and the window 115, is stored in the memory (not shown in the figures) of the signal processing part 17. This processing is performed prior to the polishing of the wafer 4.

In a fourth example of this processing, the reference spectrum obtained from the linear sensor of the optical system 144 of the measurement optical system 16 in a state in which the reflective body 50 faces the window 115 during the polishing of the wafer 4 is stored in the memory (not shown in the figures) of the signal processing part 17. Here, in cases where reference spectra are successively obtained simultaneously with measured spectra during the polishing of the wafer 4 (in the present example, for instance, the reference spectrum may also be obtained only once), the most recent reference spectrum at the point in time in question (for example) may be used when the intensity ratio of the measured spectrum is determined with the reference spectrum as a reference.

In the present working configuration, advantages similar to those of the above-mentioned first working configuration are obtained. Furthermore, if the above-mentioned fourth example is used, a reference spectrum can be obtained which reflects the effects of the polishing agent in the state in which the measured spectrum is acquired; accordingly, the effects of the polishing agent on the intensity ratio of the measured spectrum to the reference spectrum can be further reduced, so that the precision of monitoring of the polishing state can be increased even further.

Fourth Working Configuration

Figure 5:
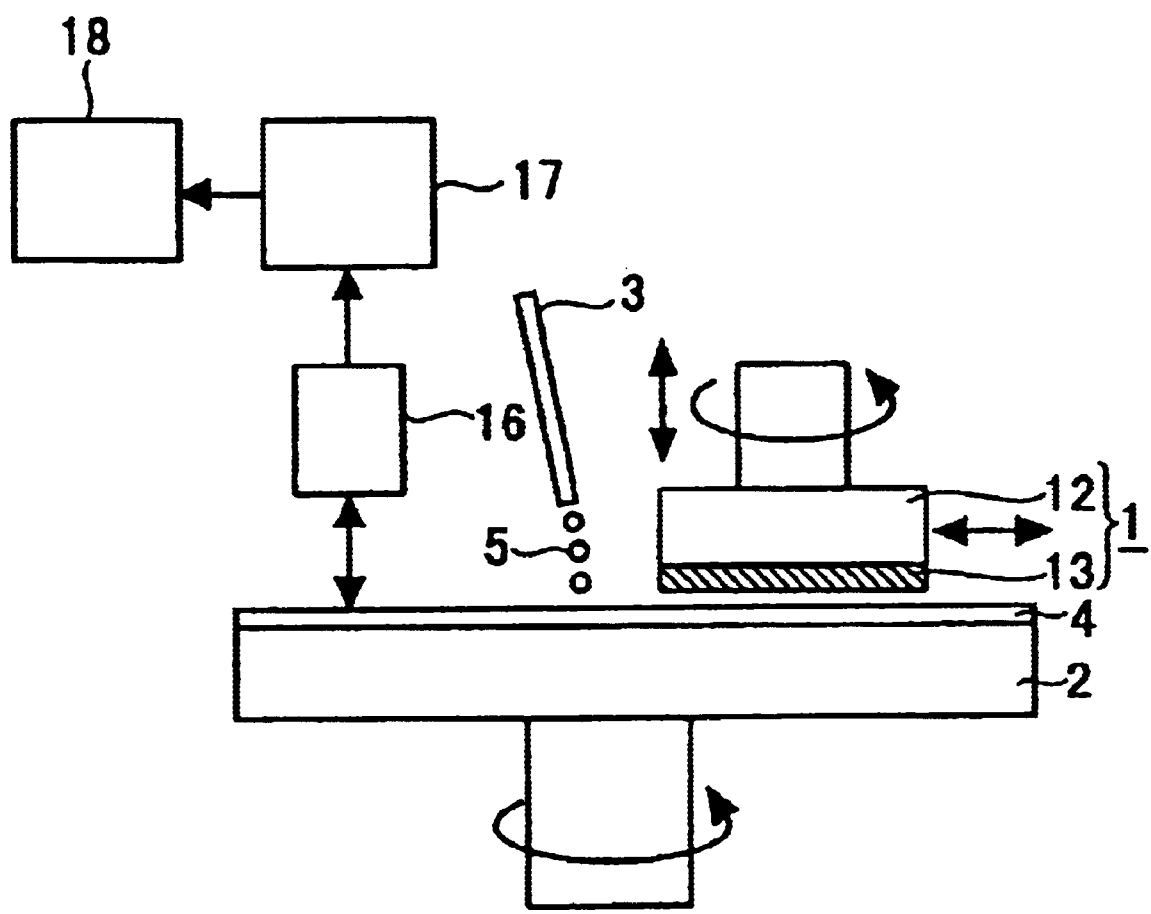
FIG. 5 is a schematic structural diagram which shows a polishing apparatus constituting still another working configuration of the present invention in model form.

FIG. 5 is a schematic structural diagram which shows a polishing apparatus constituting a fourth working configuration of the present invention in model form. In FIG. 5, elements which are the same as in FIG. 4, or which correspond to elements in FIG. 4, are labeled with the same symbols, and a redundant description of these elements is omitted.

The present working configuration differs from the above-mentioned first working configuration in the following respects: specifically, in the above-mentioned first working configuration, the polishing member 1 was constructed so that this polishing member 1 was larger than the wafer 4; in the present working configuration, on the other hand, the polishing member 1 is constructed so that it is smaller than the wafer 4, and alterations are added accordingly. In the present working configuration, the polishing member 1 swings back and forth instead of the polishing head 2. Furthermore, since the polishing member 1 is smaller than the wafer 4, a portion of the wafer 4 or reflective body 19 that is exposed from the polishing member 1 is irradiated with the probe light from the measurement optical system 16, and no window 15 is formed in the polishing body 13.

Advantages similar to those of the above-mentioned first working configuration can also be obtained using the present working configuration.

Furthermore, a working configuration similar to the working configuration shown in FIG. 4 may be obtained by modifying the above-mentioned second and third working configurations in the same manner that the fourth working configuration is obtained by modifying the first working configuration.

Furthermore, in the above-mentioned first through third working configurations, if the wafer 4 or reflective body is caused to protruded from the polishing member 1 when the polishing head 2 is caused to swing, and the system is arranged so that the protruding portion (exposed portion) is irradiated with light from the measurement optical system, then there is no need to form a window 15 or 115 in the polishing body 13.

Fifth Working Configuration

Figure 6:
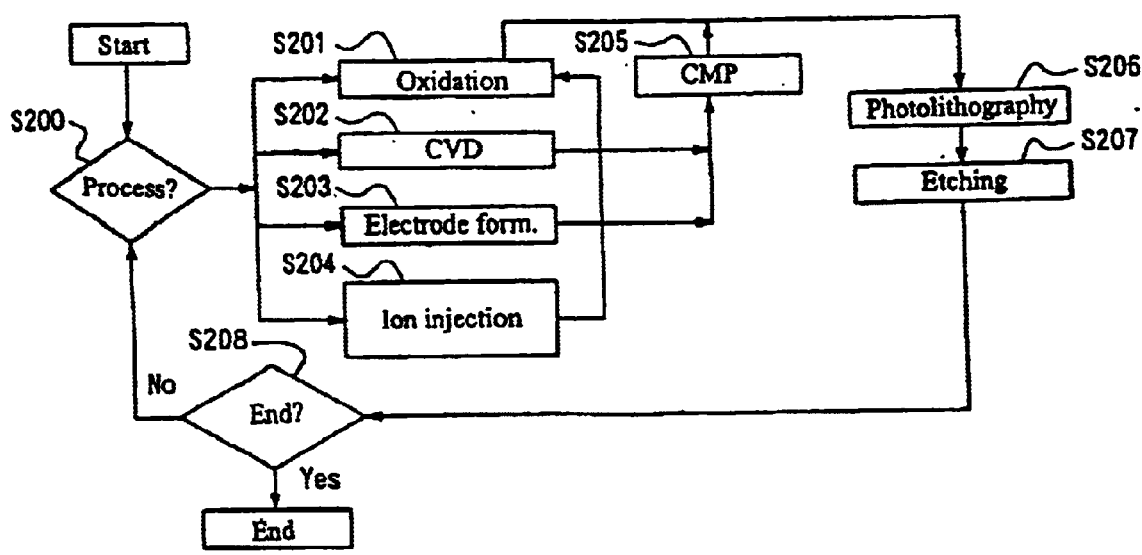
FIG. 6 is a flow chart which illustrates a semiconductor device manufacturing process constituting still another working configuration of the present invention.

FIG. 6 is a flow chart which illustrates the semiconductor device manufacturing process of the present invention. When the semiconductor device manufacturing process is started, an appropriate working process is first selected in step S200 from steps S201 through S204 described below.

The processing then proceeds to one of the steps S201 through S204 in accordance with this selection.

Step S201 is an oxidation process in which the surface of the silicon wafer is oxidized. Step S202 is a CVD process in which an insulating film is formed on the surface of the silicon wafer by CVD, etc. Step S203 is an electrode formation process in which electrodes are formed on the silicon wafer by a process such as evaporation, etc. Step S204 is an ion injection process in which ions are injected into the silicon wafer.

Following the CVD process or electrode formation process, the work proceeds to step S205. Step S205 is a CMP process. In this CMP process, the flattening of inter-layer insulation films or the formation of a damascene by the polishing of metal films on the surfaces of semiconductor devices, etc., is performed using the polishing apparatus of the present invention.

Following the CMP process or oxidation process, the work proceeds to step S206. Step S206 is a photolithographic process. In this photolithographic process, the silicon wafer is coated with a resist, a circuit pattern is burned onto the silicon wafer by exposure using an exposure apparatus, and the exposed silicon wafer is developed. Furthermore, the next step S207 is an etching process in which the portions other than the developed resist image are removed by etching, and the resist is then stripped away, so that the resist that is unnecessary when etching is completed is removed.

Next, in step S208, a judgement is made as to whether or not all of the necessary processes have been completed; if these processes have not been completed, the work returns to step S200, and the previous steps are repeated, so that a circuit pattern is formed on the silicon wafer. If it is judged in step S208 that all of the processes have been completed, the work is ended.

Since the polishing apparatus of the present invention is used in the CMP process in the semiconductor device manufacturing process which constitutes the present working configuration, the precision of polishing endpoint detection or the precision of film thickness measurement in the CMP process can be improved, so that the yield of the CMP process is improved. As a result, semiconductor devices can be manufactured at a lower cost than in conventional semiconductor device manufacturing methods.

Furthermore, the polishing apparatus of the present invention can also be used in the CMP processes of semiconductor device manufacturing processes other than the above-mentioned semiconductor device manufacturing process.

The semiconductor device of the present invention is manufactured by the semiconductor device manufacturing method of the present invention. As a result, this semiconductor device can be manufactured at a lower cost than is possible in conventional semiconductor device manufacturing methods, so that the manufacturing cost of the semiconductor device can be lowered.

EXPERIMENTAL EXAMPLE 1

Experimental Example 1 relates to the above-mentioned first working configuration. In this experimental example, an IC1000 polishing pad and Suba400 polishing pad manufactured by Rodel Co., were used as the polishing pads 13a and 13b in the polishing apparatus shown in FIGS. 1 and 2. The respective sizes of the opening parts in these polishing pads were set at 60 mm×20 mm and 50 mm×10 mm. The surface of the transparent acrylic window 15 was recessed 0.2 mm from the surface of the polishing pad 13a.

A 6-inch silicon wafer on which a thermal oxidation film had been formed to a thickness of 1 $\mu$m was used as the wafer 4 constituting the object of polishing. A mirror formed by vacuum-evaporating aluminum to a thickness of 2 $\mu$m on a 6-inch glass plate which had a thickness of 0.6 mm and which had the same shape as the above-mentioned wafer was used as the reflective body 19.

Then, the above-mentioned mirror used as the reflective body 19 was first held on the polishing head 2 in the polishing position so that the glass surface of the mirror faced downward (i.e., so that this surface contacted the polishing pad 13a).

Afterward, a polishing agent 5 (the polishing agent described later) used in the polishing of the wafer) was supplied to the surface of the polishing body 13 from the polishing agent supply part 3, and this polishing agent 5 was positioned on the window 15. Next, the above-mentioned mirror was pressed against the polishing body 13 under the same pressing conditions as those used in the polishing conditions described below. In this state, without causing any rotation or swinging of the polishing head 2, the spectrum of the light reflected from the above-mentioned mirror was measured by the measurement optical system 16, and this spectrum was stored in the memory of the signal processing part 17 as the reference spectrum.

Next, the above-mentioned wafer was held on the polishing head 2 instead of the above-mentioned mirror, and the thickness of the oxidation film on the above-mentioned wafer was measured in situ as the polishing state monitoring results while this wafer was polished under the polishing conditions shown below; this thickness was displayed on the display part 18.

The above-mentioned polishing conditions were set as follows: namely, rpm of the polishing head 2: 50 rpm, rpm of the polishing member 1 (platen rpm): 50 rpm, load applied between the polishing head 2 and polishing member 1: $1.96 \times 10^{-2}$ Pa, swinging of the polishing head 2: none, polishing agent used: SS25 manufactured by Cabot Co. (diluted 2x), polishing agent flow rate: 200 ml/min.

Specifically, the spectra successively measured by the measurement optical system 16 during the polishing of the above-mentioned wafer were respectively input into the signal processing part 17 as the measured spectra obtained at the respective points in time that the measurements were made. Each time that a measured spectrum for a respective point in time was obtained, the intensity ratio of this measured spectrum to the above-mentioned reference spectrum was calculated by the signal processing part 17; furthermore, the film thickness (remaining film thickness) of the above-mentioned oxidation film was calculated from the maximum and minimum positions of this waveform (the waveform of the intensity ratios for the respective wavelengths), and the film thickness at respective points in time was displayed on the display part 18.

Figure 7:
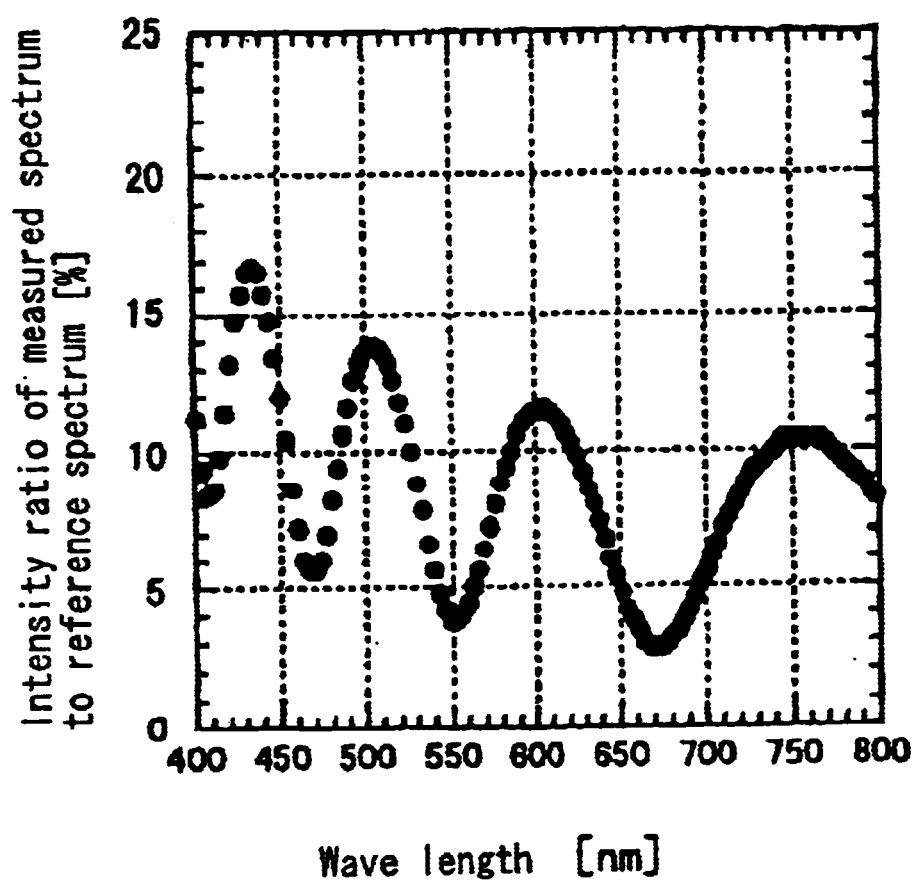
FIG. 7 is a graph which shows the intensity ratio of the measured spectrum obtained in Experimental Example 1 to the reference spectrum.
Figure 8:
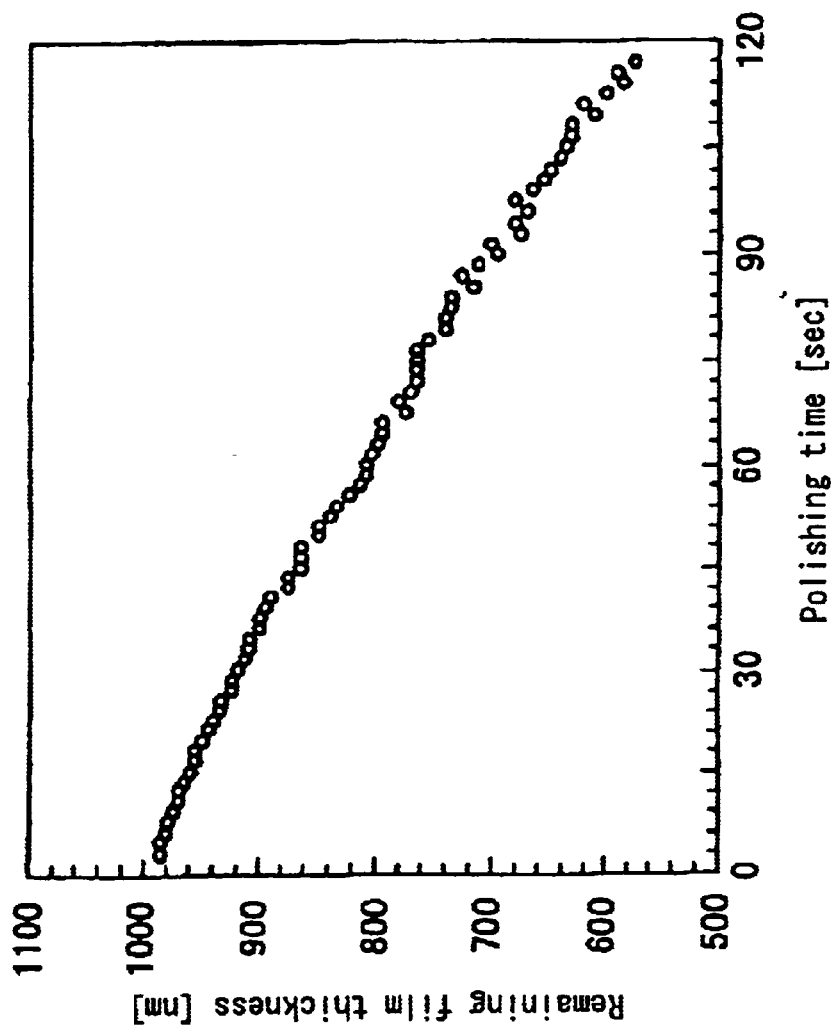
FIG. 8 is a graph which shows the residual film thickness obtained in Experimental Example 1.

FIG. 7 shows the intensity ratio of the measured spectrum obtained at a certain point in time to the above-mentioned reference spectrum in this case. Furthermore, the remaining film thickness of the oxidation film obtained as the monitoring results by this experiment is shown in FIG. 8. It is seen from FIG. 7 that the components of the oxidation film are favorably reflected in the intensity ratio of the measured spectrum to the reference spectrum, and that these results are almost unaffected by the polishing agent, etc. Furthermore, it is seen from FIG. 8 that the monitoring results are also good.

EXPERIMENTAL EXAMPLE 2

Experimental Example 2 relates to the above-mentioned third working configuration. In this experimental example, an IC1000 polishing pad and Suba400 polishing pad manufactured by Rodel Co., were used as the polishing pads 13a and 13b in the polishing apparatus shown in FIG. 4. The sizes of the two opening parts in the polishing pad 13a were respectively set at 60 mm×20 mm, and the sizes of the two opening parts in the polishing pad 13b were respectively set at 50 mm×10 mm. The surfaces of the transparent acrylic windows 15 and 115 were recessed 0.2 mm from the surface of the polishing pad 13a. The spacing of the centers of the windows 15 and 115 and the spacing of the centers of the opening parts 14 and. 114 in the platen 12 were respectively set at 100 mm. A member in which aluminum was vacuum-evaporated to a thickness of 2 μm as a metal film 52 on the surface of a transparent acrylic resin member 51 was used as the reflective body 50.

As in Experimental Example 1, a 6-inch silicon wafer on which a thermal oxidation film had been formed to a thickness of 1 μm was used as the wafer 4 constituting the object of polishing. This wafer was held on the polishing head 2 in the polishing position, and the thickness of the oxidation film on the above-mentioned wafer was measured in situ as the polishing state monitoring results while this wafer was polished under the same polishing conditions as in the above-mentioned Experimental Example 1; this thickness was displayed on the display part 18.

Specifically, the reference spectrum and measured spectrum that were measured simultaneously by the measurement optical system 16 during the polishing of the above-mentioned wafer were successively input into the signal processing part 17. Each time that a reference spectrum and a measured spectrum for a respective point in time were obtained, the intensity ratio of this measured spectrum to the simultaneously obtained reference spectrum was calculated by the signal processing part 17; furthermore, the film thickness (remaining film thickness) of the above-mentioned oxidation film was calculated from the maximum and minimum positions of this waveform (the waveform of the intensity ratios for the respective wavelengths), and the film thickness at respective points in time was displayed on the display part 18.

The intensity ratio of the measured spectrum obtained at a certain point in time to the above-mentioned reference spectrum obtained at the same point in time in this case was similar to the ratio shown in FIG. 7. Furthermore, the remaining thickness of the oxidation film obtained as the monitoring results by this experiment was similar to that shown in FIG. 8. Thus, the components of the oxidation film were favorably reflected in the intensity ratio of the measured spectrum to the reference spectrum, with these results being almost unaffected by the polishing agent, etc., and the monitoring results were also good.

COMPARATIVE EXAMPLE

Figure 9:
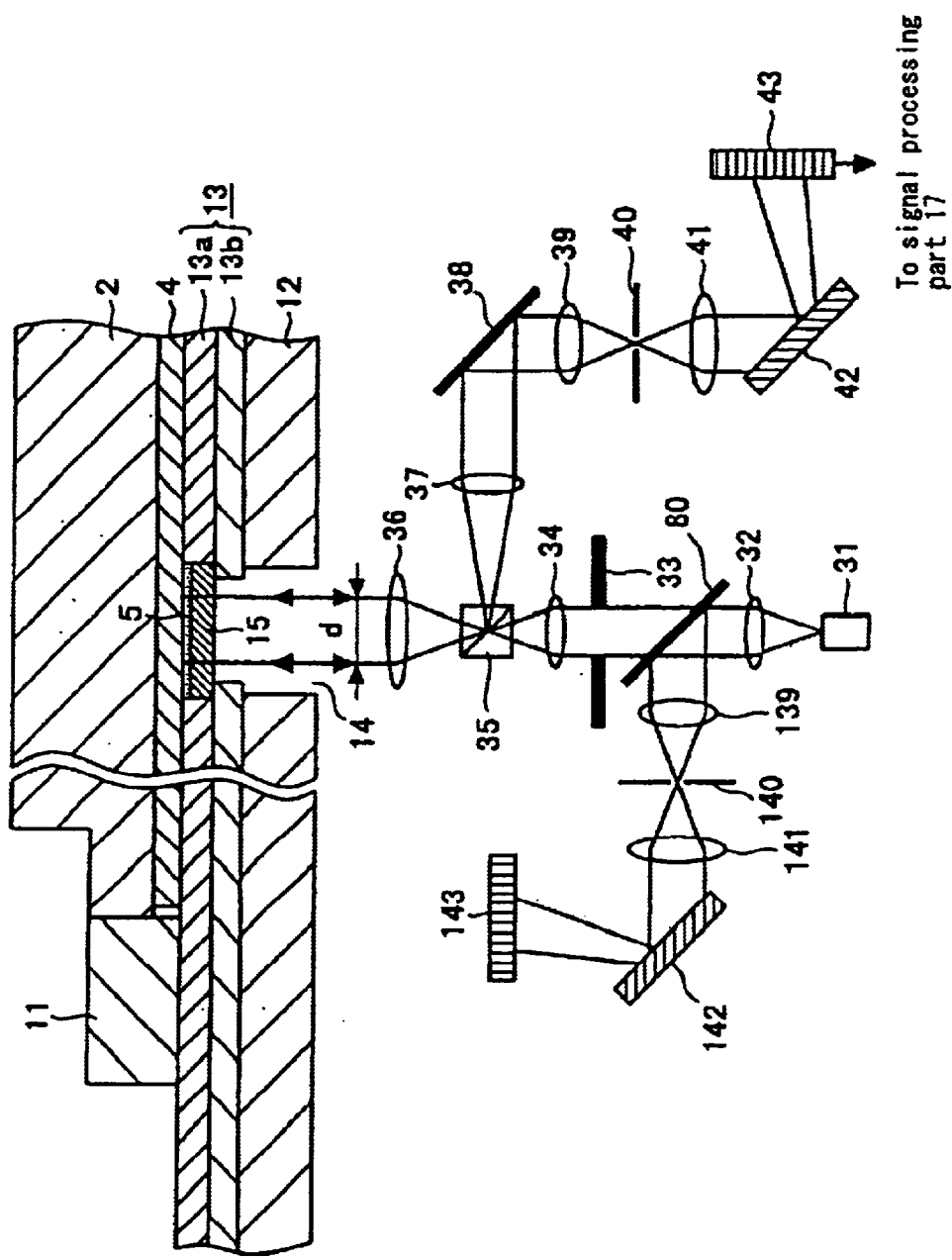
FIG. 9 is a schematic structural diagram which shows in model form a polishing apparatus used in a comparative example.

As a comparative example, a polishing apparatus was used in which the polishing apparatus shown in FIGS. 1 and 2 was modified as shown in FIG. 9. In FIG. 9, elements which are the same as elements in FIG. 2 are labeled with the same symbols.

In the polishing apparatus shown in FIG. 9, a half-mirror 80 which is disposed between the lens 32 and slit 33, and a lens 139, pinhole 140, lens 141, diffraction grating 142 and linear sensor 143 which respectively correspond to the elements 39 through 43 in the figures, are added to the measurement optical system shown in FIG. 2. As a result, the spectroscopic intensity (spectrum) of one of the light beams (not the probe light used to obtain the measured spectrum) that is produced as a result of the light emitted from the xenon lamp 31 and passed through lens 32 being split by the half-mirror 80 is obtained from the linear sensor 143. In this comparative example, as will be described later, the spectrum obtained from the linear sensor 143 was used as the reference spectrum.

In this comparative example, as in the above-mentioned Experimental Example 1, an IC000 polishing pad and a Suba400 polishing pad manufactured by Rodel Co., were used as the polishing pads 13a and 13b; the sizes of the opening parts in these polishing pads were respectively set at 60 mm×20 mm and 50 mm×10 mm, and the surface of the transparent acrylic window 15 was recessed 0.2 mm from the surface of the polishing pad 13a.

As in Experimental Example 1, a 6-inch silicon wafer on which a thermal oxidation film had been formed to a thickness of 1 μm was used as the wafer 4 constituting the object of polishing. This wafer was held on the polishing head 2 in the polishing position, and while this wafer was polished under the same polishing conditions as in the above-mentioned Experimental Example 1, the reference spectrum (spectrum obtained from the linear sensor 143) and measured spectrum (spectrum obtained from the linear sensor 43) that were simultaneously measured by the measurement optical system were successively input into the signal processing part 17. Each time that a reference spectrum and measured spectrum for a respective point in time were obtained, the intensity ratio of this measured spectrum to the simultaneously obtained reference spectrum was calculated by the signal processing part 17.

Figure 10:
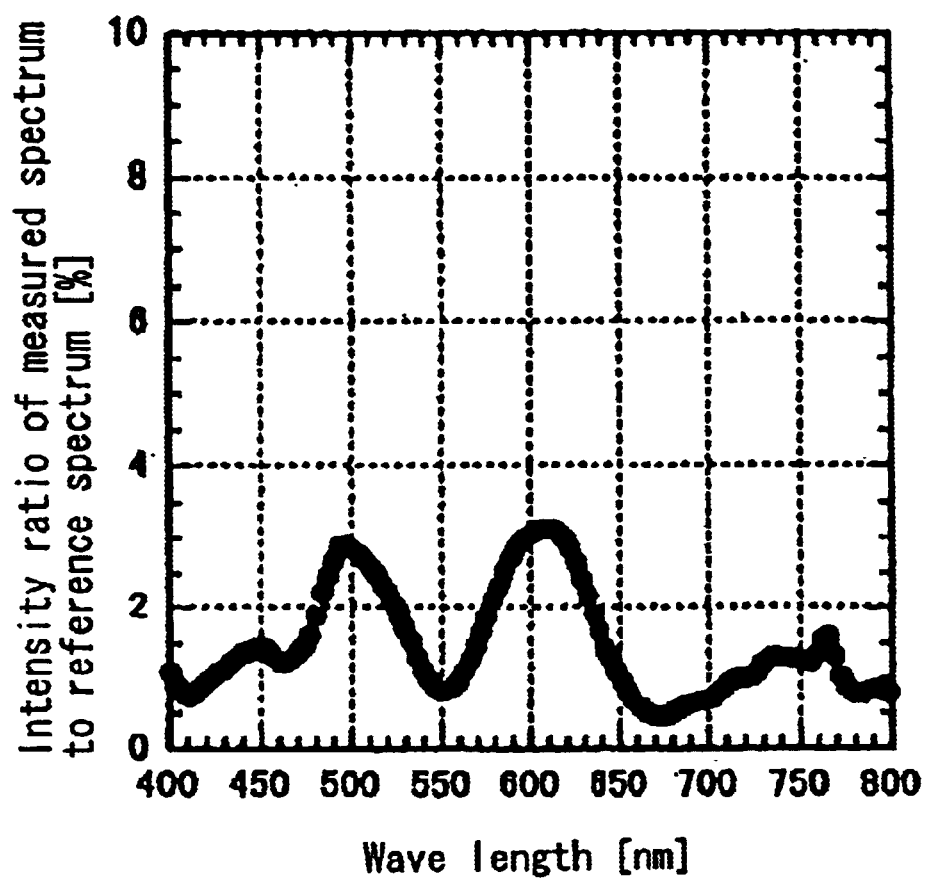
FIG. 10 is a graph which shows the intensity ratio of the measured spectrum obtained in a comparative example to the reference spectrum.

The intensity ratios thus obtained had a small S/N ratio, and showed violent fluctuations and deformations due to the effects of scattering and absorption by the polishing agent, etc. Complicated operations such as noise cutting and signal normalization, etc., were required in order to analyze this waveform (the waveform of the intensity ratios for the respective wavelengths); furthermore, considerable data that was difficult to analyze was also included. FIG. 10 shows the intensity ratio of the measured spectrum obtained at a certain point in time to the reference spectrum in this comparative example.

The precision of monitoring of the polishing state can be improved by utilizing the polishing state monitoring method and device of the present invention in a polishing apparatus. Furthermore, the polishing apparatus of the present invention can be utilized in the surface polishing of semiconductor devices, etc., and makes it possible to improve the polishing precision.

The process wafer of the present invention can be utilized in the manufacture of high-precision semiconductor devices. The semiconductor device manufacturing method of the present invention can be utilized to manufacture high-precision semiconductor devices. The semiconductor device of the present invention can be widely used in electronic circuits as a high-precision semiconductor device.

What is claimed is:

1. A polishing state monitoring method in which a polishing state of an object of polishing which is polished by application of a first load between a polishing body and the object of polishing with a polishing agent interposed between the polishing body and the object of polishing, and by causing the polishing body and the object of polishing to move relative to each other, is monitored during polishing, comprising the steps of:

irradiating a reflective body with a probe light emitter from a light source;

acquiring a reference spectrum form the light reflected from the reflective body;

irradiating the object of polishing with the probe light emitted from the light source;

acquiring a measured spectrum of the light reflected by the object of polishing during polishing; and monitoring the polishing state of the object of polishing during polishing based on a relationship between the measured spectrum and the reference spectrum.

2. The method according to claim 1, wherein the step of irradiating the reflective body is performed prior to the polishing of the object of polishing.

3. The method according to claim 1, wherein the step of irradiating the reflective body is performed during the polishing of the object of polishing.

4. The method according to claim 1, wherein the probe light is directed onto the reflective body via at least one window formed in the polishing body.

5. The method according to claim 1, wherein the reference spectrum is acquired in a state in which the polishing agent is interposed in a light path of the light that is directed onto the reflective body and the light path of the light that is reflected from this reflective body.

6. The method according to claim 1, wherein the probe light and the light that is directed onto the reflective body are directed onto portions of the object of polishing or the reflective body that are exposed from the polishing body.

7. The method according to claim 1, wherein a second load substantially equal to the first is applied between the polishing body and the reflective body.

8. The method according to claim 1, wherein polishing conditions of the reflective body are substantially the same as the polishing conditions used for the polishing of the object of polishing.

9. The method according to claim 1, wherein one of the reflective body and a member that has the reflective body has substantially the same shape and dimensions as the object of polishing.

10. The method according to claim 9, wherein the object of polishing is a process wafer.

11. The method according to claim 9, wherein one of the reflective body and the member resides in a container during the step of irradiating the object of polishing.

12. The method according to claim 9, wherein one of the reflective body and the member is disposed in a specified polishing position during the step of acquiring the reference spectrum using a device that sets the process wafer in the specified polishing position from the container.

13. The method according to claim 1, wherein the reflective body is disposed in a holding part that also holds the object of polishing during polishing.

14. The method according to claim 1, wherein the object of polishing is a process wafer and the reflective body is disposed in an area of the process wafer.

15. A polishing state monitoring device using the method according to claim 1.

* * * * *